United States Patent [19]

Inoue

[11] Patent Number: 4,821,562

[45] Date of Patent: Apr. 18, 1989

[54] SIGNAL MONITORING APPARATUS

[75] Inventor: Hiroshi Inoue, Kanagawa, Japan

[73] Assignee: Nissan Motor Company, Limited, Japan

[21] Appl. No.: 30,911

[22] Filed: Mar. 30, 1987

[30] Foreign Application Priority Data

Apr. 3, 1986 [JP] Japan .................................. 61-75507

[51] Int. Cl.[4] .......................................... G01M 19/00
[52] U.S. Cl. ................. 73/119 A; 324/77 R
[58] Field of Search ............... 73/119 A; 324/77 R, 324/418, 77 A

[56] References Cited

U.S. PATENT DOCUMENTS

| | | | |
|---|---|---|---|
| 3,828,247 | 8/1974 | Kirsch et al. | 73/119 A X |
| 4,678,345 | 7/1987 | Agoston | 324/77 R X |
| 4,678,987 | 7/1987 | Bauck | 324/77 R |
| 4,736,327 | 4/1988 | Power | 324/77 R X |

FOREIGN PATENT DOCUMENTS 56-54518  5/1981  Japan .

Primary Examiner—Jerry W. Myracle
Attorney, Agent, or Firm—Lowe, Price, LeBlanc, Becker & Shur

[57] ABSTRACT

An apparatus for monitoring a drive signal used to drive an actuator. The apparatus includes a circuit for extracting a plurality of components from the drive signal, each of the components representing a specified actuator operating characteristic. The components are stored in a memory at time intervals predetermined for the respective components.

7 Claims, 5 Drawing Sheets

4,821,562

SIGNAL MONITORING APPARATUS

BACKGROUND OF THE INVENTION

This invention relates to an apparatus for monitoring a drive signal used to drive an actuator.

Signal monitoring apparatus have been proposed, for example, in Japanese patent Kokai No. 56-54518, for monitoring a drive signal used to drive an actuator in order to check faults which may occur in the control system including the actuator. The drive signal is sampled at predetermined time intervals and the sample values are stored into a memory in a time-sharing fashion so that temporary or intermittent faults can also be checked from the stored data. Since the drive signal should be sampled at a high sampler rate to ensure reliable fault checks, the conventional apparatus requires a high-speed signal sampling device and a great-capacity memory.

SUMMARY OF THE INVENTION

Therefore, it is a main object of the invention to provide an improved signal monitoring apparatus which can store data used to ensure reliable fault check with a memory having a relatively small memory capacity.

There is provided, in accordance with the invention, an apparatus for monitoring at least one drive signal used to drive an actuator. The apparatus comprises a memory, an analyzer circuit for extracting a plurality of components from the drive signal, each of the components representing a specified actuator operating characteristic, and means connected between the analyzer circuit and the memory for storing the components into the memory at time intervals predetermined for the respective components.

BRIEF DESCRIPTION OF THE DRAWINGS

This invention will be described in greater detail by reference to the following description taken in connection with the accompanying drawings, in which like numerals identify like elements in the several figures and in which.

DETAILED DESCRIPTION OF THE PREFERRED EMBODIMENT

Figure 1:
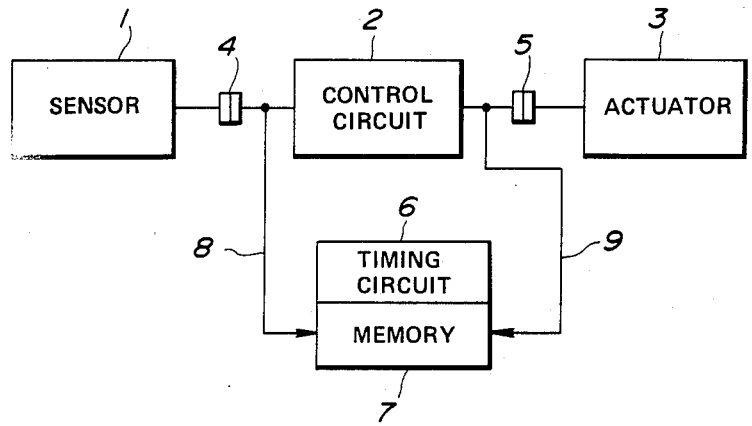
FIG. 1 is a schematic block diagram showing a prior art signal monitoring apparatus.
Figure 2:
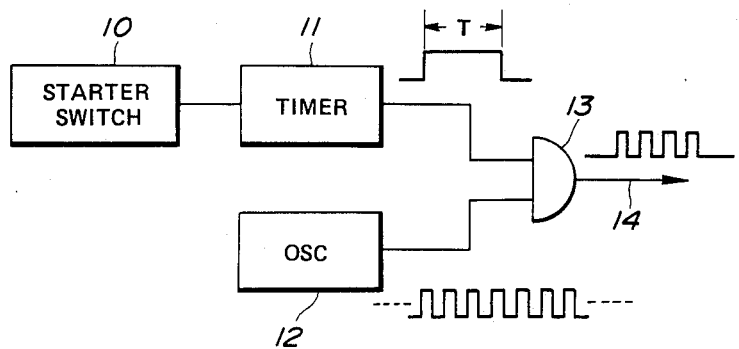
FIG. 2 is a schematic block diagram showing the timing circuit of FIG. 1.

Prior to the description of the preferred embodiment of the present invention, the prior art automotive vehicle control circuit of FIGS. 1 and 2 is briefly described in order to provide a basis for a better understanding of the difficulties attendant therewith.

Referring to FIG. 1, there is shown a schematic block diagram of a prior art automotive vehicle control apparatus including a sensor 1, a control circuit 2, and an actuator 3. The control circuit 2 is connected at its output connected to the actuator 3 through a connector 5. The sensor 1 senses a vehicle operating condition and develops a sensor signal indicative of the sensed condition. The control circuit 2 repetitively calculates a value corresponding to a setting of the actuator 3 used to control the automotive vehicle from a function describing a desired relationship between the setting of the actuator and the sensed condition and develops a control signal indicative of the calculated value. The vehicle control system also includes a memory circuit 7 which has one input connected to the input of the control circuit 2 through a signal line 8 and another input connected to the output of the control circuit 2 through a signal line 9. The memory circuit 7 stores the sensor and control signals in a time-sharing fashion at predetermined time intervals on a command from a timing circuit 6. The stored data are read out of the memory circuit 7 for checking a fault which may occur in the vehicle control circuit.

Referring to FIG. 2, the timing circuit 6 includes a timer 11 which is actuated at a desired time for developing a control pulse having a predetermined pulse width T. For example, the timer 11 develops such a control pulse when the starter switch 10 is turned on. The control pulse is applied to open an AND gate 13 so as to communicate a predetermined number of pulses generated at a predetermined frequency from an oscillator 12. The command pulse signal, which is developed on the line 14, is applied to cause the memory circuit 7 (FIG. 1) to store the data in a time-sharing fashion at predetermined time intervals for a time period corresponding to the width T of the control pulse. The timer 11 is effective to limit the time during which the data are read into the memory circuit 6 in order to use the limited memory capacity with greater efficiency.

In order to make reliable fault checks, the rate at which the memory circuit 7 stores should be greater than the rate, for example, 1 microsecond at which the control circuit 2 samples the sensor signal fed thereto from the sensor 1. For this reason, the memory circuit 7 is required to have a very great memory capacity for storing data in a time-sharing fashion. In addition, the analog-to-digital converter, the sample holding circuit, and other components required to handle analog signals should operate at very high speeds, resulting in a complex and expensive circuit arrangement.

Accordingly, it is a problem with such a prior art vehicle control system to ensure reliable fault checks with a memory circuit having a relatively small memory capacity and a relatively slow operating speed.

Figure 3:
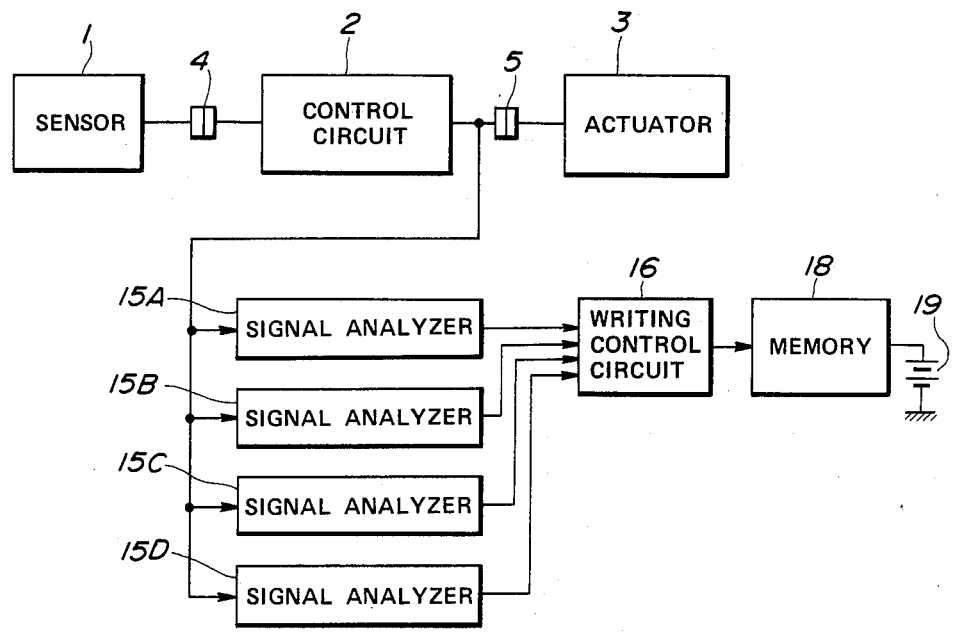
FIG. 3 is a schematic block diagram showing one embodiment of a signal monitoring apparatus made in accordance with the invention.

Referring to FIG. 3, there is illustrated one embodiment of a signal monitoring apparatus made in accordance with the invention. The same reference numerals have been used as were used in FIG. 1 to identify the same parts.

The signal monitoring apparatus according to the invention is shown as including four signal analyzer circuits 15A ... 15D each having an input connected to the output of the control circuit 2 and having an output connected through a writing control circuit 16 to a memory circuit 18. The signal analyzer circuits 15A ... 15D extract four different signal components from the control signal fed thereto from the control circuit 2. The writing control circuit 16 reads the respective signal components into the memory circuit 18 at predetermined time intervals less than the reciprocal of the maximum frequency fmax of the signal components fed from the signal analyzer circuits 15A ... 15D. Although the memory circuit 18 is shown as connected to a backup battery 19 used to hold the data stored in the memory circuit 18 after the system power source is disconnected therefrom, it is to be noted that the backup battery may be removed if the memory circuit 18 is a nonvolatile memory.

Figure 4:
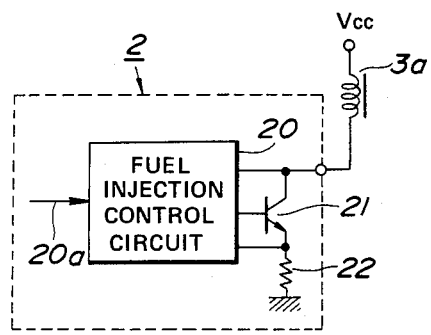
FIG. 4 is a schematic circuit diagram showing one example of the control circuit of FIG. 3.

The signal monitoring apparatus will be described in greater detail in connection with a fuel injection control circuit, as shown in FIG. 4. It will be understood that the illustrated control circuit is shown and described only to facilitate a more complete understanding of the signal monitoring apparatus embodying the invention and there is no intention to limit the invention to such fuel injection control apparatus.

Referring to FIG. 4, the control circuit 2 is shown as including a fuel injection control circuit 20 and a switching transistor 21. The control circuit 20 receives an injection timing pulse signal developed on a signal line 20a. The switching transistor 21 has a base electrode connected to the control circuit 20, a collector electrode connected to a source of constant voltage Vcc through a solenoid coil 3a used to drive one or more fuel injection valves, and an emitter electrode connected to electric ground through a resistor 22. The control circuit 20 has an input connected to the junction between the emitter of the transistor 21 and 22 the resistor 22 for the purpose of sensing the current flow through the resistor 22 for feedback control of the drive current flow through the solenoid coil 3a. The control circuit 20 has another input connected to the collector of the transistor 21 for the purpose of sensing the voltage developed thereat.

The operation is as follows. Each time an injection timing pulse is developed on the line 20a, the control circuit 20 generates a control signal to operate the switching transistor 21 in a manner to switch the drive current through the solenoid coil 3a in such a chopping fashion that the drive current has a predetermined waveform, as illustrated by curve (B) of FIG. 5. The drive current changes in successive four phases. In the first which continues for a time T1, the drive current increases at a predetermined rate to a value $I_0$ required to open the fuel injection valve. In the second phase which continues for a time T2, the drive current decreases at a predetermine rate from the value $I_0$ to a value $I_1$ required to retain the fuel injection valve open. In the third phase which continues for a time T3, the drive current is held at a value somewhat greater than the value $I_1$. In the fourth phase, the drive current decreases to zero so as to close the fuel injection valve. The drive current remains at zero until the next injection timing pulse. The control circuit 20 senses the drive voltage developed at the collector of the transistor 21. The drive voltage has a waveform, as illustrated by curve (A) of FIG. 5, while the switching transistor 21 is operating to produce the drive current, as indicated by curve (B) of FIG. 5, through the solenoid coil 3a. Such a drive current waveform is effective to minimize the power consumption and the power loss in the valve drive circuit.

The control circuit 2 generates a signal indicative of the sensed drive voltage to the signal analyzer circuits 15A ... 15D which extract four different signal components from the drive voltage signal. These signal components are fed to the writing control circuit 16 which stores them into the memory circuit 18.

Figure 5:
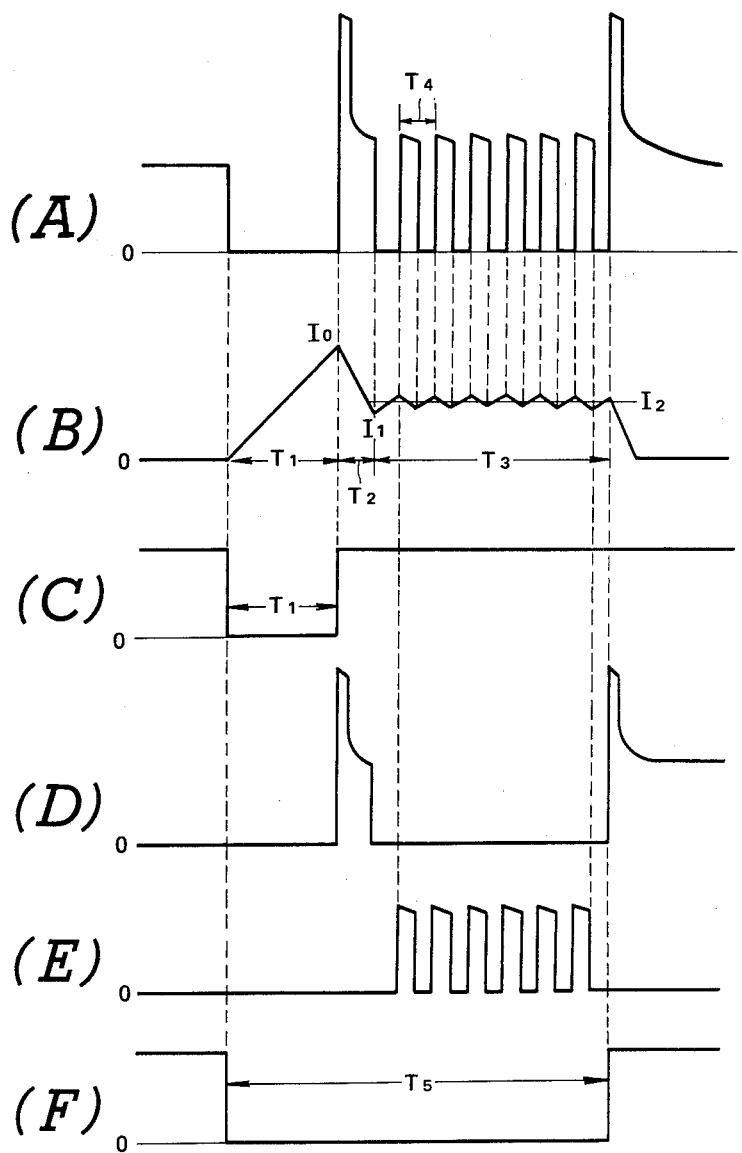
FIG. 5 contains six waveforms obtained at various points in the schematic diagram of FIG. 3.

Referring to curve (C) of FIG. 5, there is illustrated the waveform of the signal obtained at the output of the signal analyzer circuit 15A. This waveform, which is obtained when the drive current is in the first phase, provides an indication of the time during which the drive current increases toward the value $I_0$. If the signal has a pulse width shorter than a predetermined value T1, it means that the drive current shifts to the next phase before the drive current increases to the value $I_0$ so that the fuel injection valve fails to open.

Referring to curve (D) of FIG. 5, there is illustrated the waveform of the signal obtained at the output of the signal analyzer circuit 15B. This waveform, which corresponds to a counter electromotive force produced by the solenoid coil 3a when the transistor 21 is turned off, provides an indication of the inductance characteristic of the solenoid coil 3a. The magnitude of the counter electromotive force changes to a smaller value due to changes with time or a short circuit made in the solenoid coil 3a. The switching transistor 21 is normally connected to a plurality of solenoid coils connected in parallel with each other for driving corresponding fuel injection valves. In this case, if a short circuit occurs in any one of the solenoid coils, the waveform, as shown by curve (D) of FIG. 5, will change to indicate such a failure.

Referring to curve (E) of FIG. 5, there is illustrated the waveform of the signal obtained at the output of the signal analyzer circuit 15C. This waveform, which is obtained when the drive current is in the third phase during which the transistor 21 is switched on and off at predetermined time intervals so that the average level of the drive current can be held at the value $I_2$ required to retain the fuel injection valve open, indicates the duty ratio of the drive voltage which can be used in checking the manner in which the fuel injection valve is driven. If the intervals at which the transistor 21 is switched on and off becomes greater than a predetermined value T4, the drive current decreases a level causing a failure to retain the fuel injection valve open. If a connection fault occurs in any one of the solenoid coils connected in parallel with each other, the intervals at which the drive current is switched on and off will change in an abnormal fashion.

Referring to curve (F) of FIG. 5, there is illustrated the waveform of the signal obtained at the output of the signal analyzer circuit 15D. This waveform has a pulse width T5 which indicates the time period of opening operation of the fuel injection valve. The pulse width T5 determines the amount of fuel through the fuel injection valve.

Figure 6:
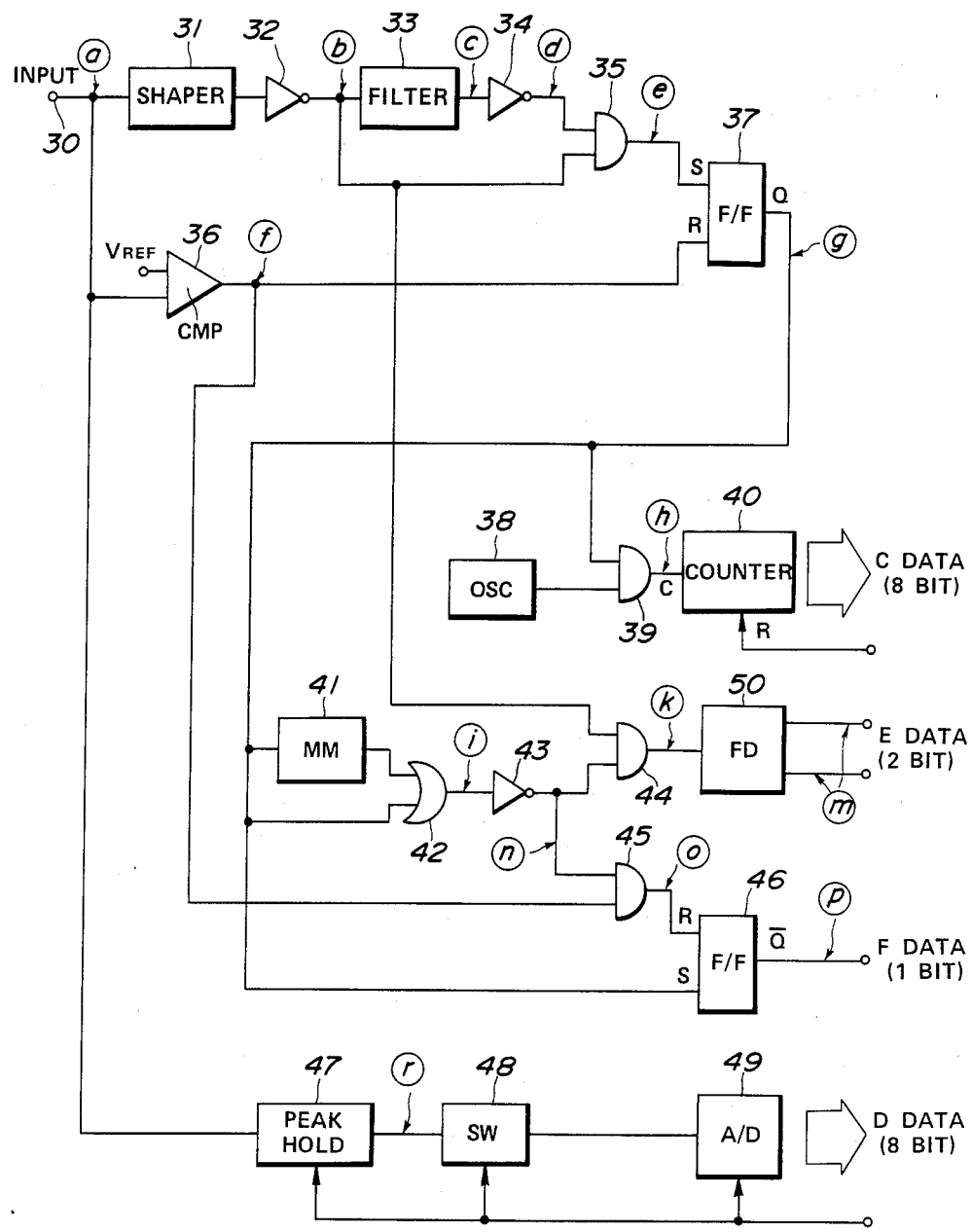
FIG. 6 is a circuit diagram showing the signal analyzers of FIG. 3.
Figure 7:
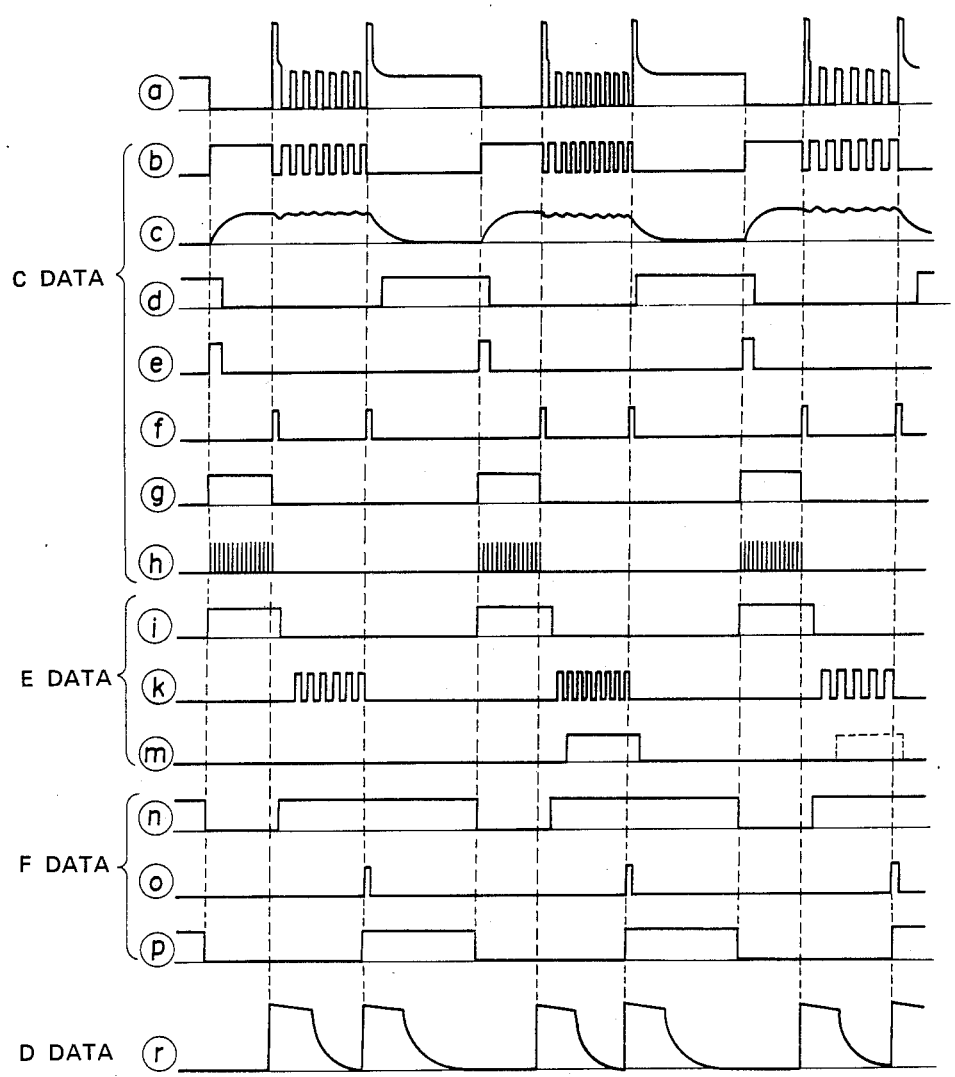
FIG. 7 contains waveforms obtained at various points in the circuit diagram of FIG. 6.

Referring to FIGS. 6 and 7, the signal analyzer circuits 15A ... 15D will be described in greater detail. The drive voltage signal is applied from the control circuit (FIG. 1) to an input terminal 30. The drive voltage signal has a waveform, as shown by curve a of FIG. 7, which is the same as the waveform as shown by curve (A) of FIG. 5. The input terminal 30 is connected through a waveform shaper circuit 31 to an inverter circuit 32. The waveform shaper circuit 31 limits the amplitude of the drive voltage signal to a predetermined maximum value. The inverter circuit 32 inverts the signal fed thereto from the waveform shaper 31 and develops a signal, as shown by curve b of FIG. 7.

The output of the inverter circuit 32 is coupled to one input of an AND gate 35 having another input connected to the output of the inverter circuit 32 through a filter circuit 33 and an inverter 34. The filter circuit 33 employs a low pass filter which converts the input signal, as shown by curve b of FIG. 7, to a signal, as shown by curve c of FIG. 7, which is applied to the inverter circuit 34 where it is inverted into a signal, as shown by curve d of FIG. 7. This inverted signal is applied to open the AND gate 35 so as to communicate the signal from the inverter circuit 32. The signal developed at the output of the AND gate 35 is shown by curve e of FIG. 7. The output of the AND gate 35 is coupled to the set terminal S of an RD flip-flop circuit 37 which has a reset terminal R connected to the output of a comparator circuit 36. The comparator circuit 36 has one input connected to the input terminal 30 and another input connected to a source of reference voltage $V_{REF}$. The comparator circuit 36 compares the drive voltage signal with a reference value and produces a high output when the drive voltage signal is greater than the reference voltage $V_{REF}$. The signal developed at the output of the comparator circuit 36 is shown by curve f of FIG. 7. The RS flip-flop circuit 37 produces a signal, as shown by curve g of FIG. 7, which changes to a logic 1 level at the leading edge of the signal fed to its set terminal from the AND gate 35 and changes to a logic 0 level at the leading edge of the signal fed to its reset terminal from the comparator circuit 36. The signal developed at the output Q of the RS flip-flop circuit 37 is shown by curve g of FIG. 7.

The output of the RS flip-flop circuit 37 is connected to one input of an AND gate 39, another input of which is connected to an oscillator 38 which generates clock pulses at a predetermined frequency. The output of the AND gate 39 is connected to a counter 40. When the signal fed from the RS flip-flop circuit 37 to the AND gate 39 is at a logic 1 level, the AND gate 39 opens to communicate clock pulses from the oscillator 38 to the counter 40. The signal developed at the output of the AND gate 39 is shown by curve h of FIG. 7. The counter 40 counts the inputted clock pulses. A reset signal is applied to reset the counter 40 upon termination of each cycle of the fuel injection valve operation. It can be seen that the count accumulated on the counter 40 corresponds to the pulse width T1 as described previously in connection with curve (C) of FIG. 5. The count (C data, for example, 8-bit data) is stored in the memory circuit 18 under the control of the writing control circuit 16.

The output of the RS flip-flop circuit 37 is connected through a monostable multivibrator circuit 41 to one input of an OR gate 42 having another input connected to the output of the RS flip-flop circuit 37. The monostable multivibrator circuit 41 is triggered to an alternative state at the leading edge of a logic 1 signal fed thereto from the RS flop-flop circuit 37. The time during which the monostable multivibrator circuit 41 is in the alternative state is set at a value somewhat longer than the time during which the input signal is at the logic 1 level. The signal developed at the output of the monostable multivibrator circuit 41 and at the output of the OR gate 42 is shown by curve i of FIG. 7.

The output of the OR gate 42 is connected to an inverter circuit 43 which in turn is connected to one input of an AND gate 44 having another input connected to the output of the inverter 32. The output of the AND gate 44 is connected to a frequency discriminator circuit 50. The inverter circuit 43 inverts the signal developed at the output of the OR gate 42. The signal developed at the output of the inverter circuit 43 is shown by curve n of FIG. 7. This signal, which is at a logic 1 for the time T3 (FIG. 5), is applied to open the AND gate 44 so as to communicate the signal developed at the output of the inverter circuit 32, as shown by curve b of FIG. 7, to the frequency discriminator circuit 50. The frequency discriminator circuit 50 compares the frequency (f) of the signal inputted thereto from the AND gate 44 with lower and upper reference value (fl) and (fh) and produces a logic 0 output when the frequency (f) is greater than a lower reference frequency (fl) and smaller than an upper reference frequency (fh) and a logic 1 output when the frequency (f) is equal to or smaller than the lower reference frequency (fl) or the frequency (f) is equal to or greater than the upper reference frequency (fh). The signal (2-bit data) developed at the output of the frequency discriminator circuit 50 is shown by curve m of FIG. 7. This signal (E data) is stored in the memory circuit 18 under the control of the writing control circuit 16.

The output of the inverter circuit 43 is connected to one input of an AND gate 45 having another input connected to the output of the comparator circuit 36. The output of an AND gate 45 is connected to the reset terminal R of an RS flip-flop circuit 46 which has a set terminal S connected to the output of the RS flip-flop circuit 37. When the signal fed to the AND gate 45 from the inverter circuit 43 is at a logic 1 level, the AND gate 45 opens to communicate the signal from the comparator circuit 36 to return the RS flip-flop circuit 46 to its initial state. The RS flip-flop circuit 46 changes to its alternative state at the leading edge of the logic 1 signal from the RS flip-flop circuit 37. The signal developed at the output of the RS flip-flop circuit 46 is shown by curve p of FIG. 7. The time during which the output of the RS flip-flop circuit 46 is at the logic 0 level corresponds to the time T5 as described previously in connection with curve (F) of FIG. 5. This signal (F data, 1-bit data) is stored in the memory circuit 18 under the control of the writing control circuit 16.

The input terminal 30 is also connected to a peak holding circuit 47. The output of the peak holding circuit 47 is connected through an analog signal 48 to an analog-to-digital converter 49. The peak holding circuit 47, the analog switch 48 and the analog-to-digital converter 49 are controlled by a control signal applied thereto. The peak holding circuit 47 holds peak values of the signal, as shown by curve a of FIG. 7. The sample peak values corresponds to the pulses produced by the counter electromotive forces produced by the solenoid coil 3a, as shown by curve r of FIG. 7. This signal is applied through the analog switch 48 to the analog-to-digital converter 49 where it is converted into a corresponding digital signal (D data). This signal (for example, 8-bit data) is stored in the memory circuit 18 under the control of the writing control circuit 16.

The drive voltage, as shown by curve (A) of FIG. 5, is produced at time intervals of occurrence of the fuel injection timing pulse signal which is developed on the line 20a (FIG. 4) in synchronism with engine rotation. Therefore, the time interval of occurrence of the drive voltage developed at the collector of the switching transistor 21 is at maximum when the engine is idling and at minimum when the engine rotates at an upper limit frequency, for example, 6,000 rpm.

Assuming now that the upper limit frequency of rotation of the engine is 6,000 rpm, the writing control circuit 16 may sample the data fed thereto from the signal analyzer circuits 15A to 15D and store them into the memory circuit 18 at time intervals of about 3 milliseconds. Therefore, the writing control circuit 16 may sample the C data, which represent the time period T1, as shown by curve (C) of FIG. 5, at time intervals of 3 milliseconds since the C data are produced from the counter 40 once in each of the sampling cycles of the writing control circuit 16. Similarly, the writing control circuit 16 may sample the E data, which represent the drive current switching frequency, as shown by curve (E) of FIG. 5, at time intervals of 3 milliseconds since the E data are produced from the frequency discriminator circuit 50 once in each of the sampling cycles of the writing control circuit 16. The writing control circuit 16 may sample the D data, which represent the counter electromotive force produced by the solenoid coil 3a, at time intervals of about 1 milliseconds since the D data are produced from the A/D converter 49 twice in each of the sampling cycle of the writing control circuit 16. The writing control circuit 16 may sample the F data, which represent the time period T5 of opening operation of the fuel injection valve, as shown by curve (F) of FIG. 5, at time intervals of about 0.1 milliseconds since it should sample values on the waveform shown by curve d of FIG. 7.

The C data produced from the counter 40 are 8-bit data and the D data produced from the A/D converter 49 are 8-bit data. The E data produced from the frequency descrimination circuit 50 are 2-bit data since the frequency discriminator circuit 50 produces an output in three different states including a first state when the frequency (f) is in the range defined between upper and lower limits (fh) and (fl), a second state when the frequency (f) is equal to or smaller than the lower limit (fl), and a third state when the frequency (f) is greater than the upper limit (fh). The F data produced from the RS flip-flop circuit 46 are 1-bit data since the RS flip-flop circuit 46 produces an output changing between two different levels including a logic 0 level at the start of opening operation of the fuel injection valve and a logic 1 level at the end of opening operation of the fuel injection valve.

The bit number (C) required for the memory circuit 18 to store the C data for six seconds is calculated as (C)=(6 sec/0.003 sec)×8 bits=2000×8 bits. The bit number (D) required for the memory circuit 18 to store the D data for six seconds is calculated as (D)=(6 sec/0.001 sec)×8 bits=6000×8 bits. The bit number (E) required for the memory circuit 18 to store the E data is calculated as (E)=(6 sec/0.003 sec)×2 bits=2000×2 bits. The bit number (F) required for the memory circuit 18 to store the F data for six second is calculated as (F)=(6 sec/0.0001 sec)×1 bits=6000×1 bits. Therefore, the bit number required for the memory circuit 18 to store the C, D, E and F data for six seconds is calculated as (C)+(D)+(E)+(F)=128,000 bits.

In order to obtain data sufficient to ensure reliable fault checks by sampling the drive voltage signal, as shown by curve (A) of FIG. 5, in a time-sharing fashion, it is required to sample the drive voltage signal at time intervals of at least 5 microseconds. Assuming that the analog value resolving power is 8 bits as obtained in the inventive apparatus, the bit number required for the associated memory circuit to store the sampled drive voltage signal values for six seconds is calculated as (6 sec/0.000005 sec)×8 bits=1,200,000 bits. The required memory capacity is ten times greater in such a conventional apparatus than in the inventive apparatus. It is therefore, apparent that the inventive apparatus can reduce the required signal sampling rate and the required memory capacity to a great extent.

While the invention has been described in connection with one or more fuel injection valves, it is to be understood that the invention is equally applicable to other actuators driven by a drive signal which can be resolved into a plurality of portions each representing a specified actuator operating characteristic. In addition, while the invention has been described in conjunction with a specific embodiment thereof, it is evident that many alternatives, modifications and variations will be apparent to those skilled in the art. Accordingly, it is intended to embrace all alternatives, modifications and variations that fall within the scope of the appended claims.

What is claimed is:

1. An apparatus for monitoring at least one drive signal used to drive an actuator, comprising:
   a memory;
   an analyzer circuit for extracting a plurality of components corresponding to respective portions of the drive signal, the components representing different actuator operating characteristics; and
   means connected between the analyzer circuit and the memory for storing the respective components into the memory at time intervals predetermined for the respective components.

2. The apparatus as claimed in claim 1, wherein the drive signal has first to fourth portions used for driving at least one solenoid coil to operate a fuel injection valve between closed and open positions, the first portion representing a time required for changing the fuel injection valve from its closed position to its open position, the second portion representing a counter electromotive force produced by the solenoid coil, the third portion representing a frequency at which the drive signal is switched to retain the fuel injection valve at its open position, the fourth portion representing a time period during which the fuel injection valve is operating.

3. The apparatus as claimed in claim 2, wherein the components include a component having a digital value corresponding to the time required for changing the fuel injection valve from its closed position to its open position.

4. The apparatus as claimed in claim 2, wherein the components include a component corresponding to the drive signal second portion.

5. The apparatus as claimed in claim 2, wherein the components include a component having a first state when the drive signal third portion has a frequency within a range defined by predetermined upper and lower limits, a second state when the drive signal third portion has a frequency greater than the upper limit, and a third state when the drive signal third portion has a frequency less than the lower limit.

6. The apparatus as claimed in claim 2, wherein the components include a component having a first level at the start of opening operation of the fuel injection valve and a second level at the end of opening operation of the fuel injection valve.

7. The apparatus as claimed in claim 2, wherein the components includes first to fourth components, the first component having a digital value corresponding to the time required for opening the fuel injection valve, the second component corresponding to the drive signal second portion, the third component having a first state when the drive signal third portion has a frequency within a range defined by predetermined upper and lower limits, a second state when the drive signal third portion has a frequency greater than the upper limit, and a third state when the drive signal third portion has a frequency less than the lower limit, the fourth component having a first level at the start of opening operation of the fuel injection valve and a second level at the end of opening operation of the fuel injection valve.

* * * * *